(12) United States Patent
Lee et al.

(10) Patent No.: US 11,521,836 B2
(45) Date of Patent: Dec. 6, 2022

(54) PLASMA PROCESSING APPARATUS

(71) Applicant: SAMSUNG ELECTRONICS CO., LTD., Suwon-si (KR)

(72) Inventors: Eun-Woo Lee, Seongnam-si (KR); Kyo-Hyeok Kim, Seoul (KR); Hyo-Sung Kim, Suwon-si (KR); Jong-Woo Sun, Hwaseong-si (KR); Seung-Bo Shim, Seoul (KR); Kyung-Hoon Lee, Seoul (KR); Jae-Hyun Lee, Yongin-si (KR); Ji-Soo Im, Seongnam-si (KR); Min-Young Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 16/407,508

(22) Filed: May 9, 2019

(65) Prior Publication Data
US 2020/0152427 A1  May 14, 2020

(30) Foreign Application Priority Data
Nov. 13, 2018  (KR) .................. 10-2018-0139392

(51) Int. Cl.
*H01J 37/32* (2006.01)
*H01J 37/21* (2006.01)
(52) U.S. Cl.
CPC ........ *H01J 37/32642* (2013.01); *H01J 37/21* (2013.01); *H01J 37/32091* (2013.01); *H01J 37/32532* (2013.01)

(58) Field of Classification Search
USPC .......................................... 156/915
See application file for complete search history.

(56) References Cited

U.S. PATENT DOCUMENTS

| | | | |
|---|---|---|---|
| 6,949,165 B2 | 9/2005 | Koshimizu | |
| 8,211,324 B2 | 7/2012 | Dhindsa et al. | |
| 8,563,619 B2 | 10/2013 | Dhindsa et al. | |
| 8,911,588 B2 | 12/2014 | Nam et al. | |
| 2007/0227450 A1* | 10/2007 | Maebashi | C23C 16/4405 118/723 R |
| 2017/0018411 A1* | 1/2017 | Sriraman | H01J 37/32568 |
| 2017/0200588 A1* | 7/2017 | Joubert | C23C 4/134 |
| 2017/0213753 A1* | 7/2017 | Rogers | H01J 37/32715 |
| 2018/0025891 A1* | 1/2018 | Marakhtanov | H01J 37/3299 438/714 |
| 2018/0350566 A1* | 12/2018 | Tobe | H01J 37/32642 |
| 2018/0366305 A1* | 12/2018 | Nagami | H01J 37/32642 |
| 2019/0006155 A1* | 1/2019 | Zhao | H01J 37/32577 |
| 2019/0013184 A1* | 1/2019 | Cui | H01J 37/32183 |

FOREIGN PATENT DOCUMENTS

JP  2009-44075  2/2009

* cited by examiner

*Primary Examiner* — Ram N Kackar
(74) *Attorney, Agent, or Firm* — F. Chau & Associates, LLC

(57) ABSTRACT

A plasma processing apparatus includes a substrate chuck having a first surface for supporting a substrate, a second surface opposite to the first surface, and a sidewall, a focus ring for surrounding a perimeter of the substrate, and an edge block for supporting the focus ring. The edge block includes a side electrode on the sidewall of the substrate chuck and a bottom electrode on the second surface of the substrate chuck.

18 Claims, 10 Drawing Sheets

PLASMA PROCESSING APPARATUS

CROSS-REFERENCE TO RELATED APPLICATION

This application claims priority under 35 U.S.C. § 119 to Korean Patent Application No. 10-2018-0139392, filed on Nov. 13, 2018, in the Korean Intellectual Property Office, the disclosure of which is incorporated by reference herein in its entirety.

TECHNICAL FIELD

Exemplary embodiments of the inventive concept relate to a semiconductor manufacturing apparatus, and more specifically, to a plasma processing apparatus.

DISCUSSION OF RELATED ART

In general, processes, such as a deposition process, an etch process, or a cleaning process, are performed to manufacture semiconductor devices. Such processes may be performed through a deposition apparatus, an etch apparatus, and/or a cleaning apparatus that include a process chamber. For example, in an etch process, a plasma etch apparatus using a capacitively coupled plasma or an inductively coupled plasma has been used to etch a material layer on a substrate. As semiconductor devices are miniaturized and become highly integrated, it may be desirable for the semiconductor manufacturing processes to have uniform process characteristics.

SUMMARY

According to an exemplary embodiment of the inventive concept, a plasma processing apparatus may include a substrate chuck having a first surface for supporting a substrate, a second surface opposite to the first surface, and a sidewall, a focus ring for surrounding a perimeter of the substrate, and an edge block for supporting the focus ring. The edge block includes a side electrode on the sidewall of the substrate chuck and a bottom electrode on the second surface of the substrate chuck.

According to an exemplary embodiment of the inventive concept, a plasma processing apparatus may include a substrate chuck having a first surface for supporting a substrate, a second surface opposite to the first surface, and a sidewall, a focus ring for surrounding a perimeter of the substrate, an edge block including a body and an electrode in the body, where the body covers at least a portion of the sidewall and the second surface of the substrate chuck, and the electrode includes a side electrode on the sidewall of the substrate chuck and a bottom electrode on the second surface of the substrate chuck, a power supply unit for supplying radio frequency (RF) power to the substrate chuck, and a control unit the control unit including a variable capacitor connected to the electrode of the edge block. The control unit is configured to control an RF coupling operation between the substrate chuck and the electrode of the edge block by controlling the variable capacitor.

According to an exemplary embodiment of the inventive concept, a plasma processing apparatus may include a substrate chuck having a first surface for supporting a substrate and a second surface opposite to the first surface, a focus ring for surrounding a perimeter of the substrate, an edge block for supporting the focus ring, and including a plurality of sub-electrodes that are radially spaced apart from one another along a circumference of the substrate chuck, a power supply unit for supplying radio frequency (RF) power to the substrate chuck, and a control unit for controlling an RF coupling operation between the substrate chuck and each of the plurality of sub-electrodes.

DETAILED DESCRIPTION OF THE EMBODIMENTS

Figure 1:
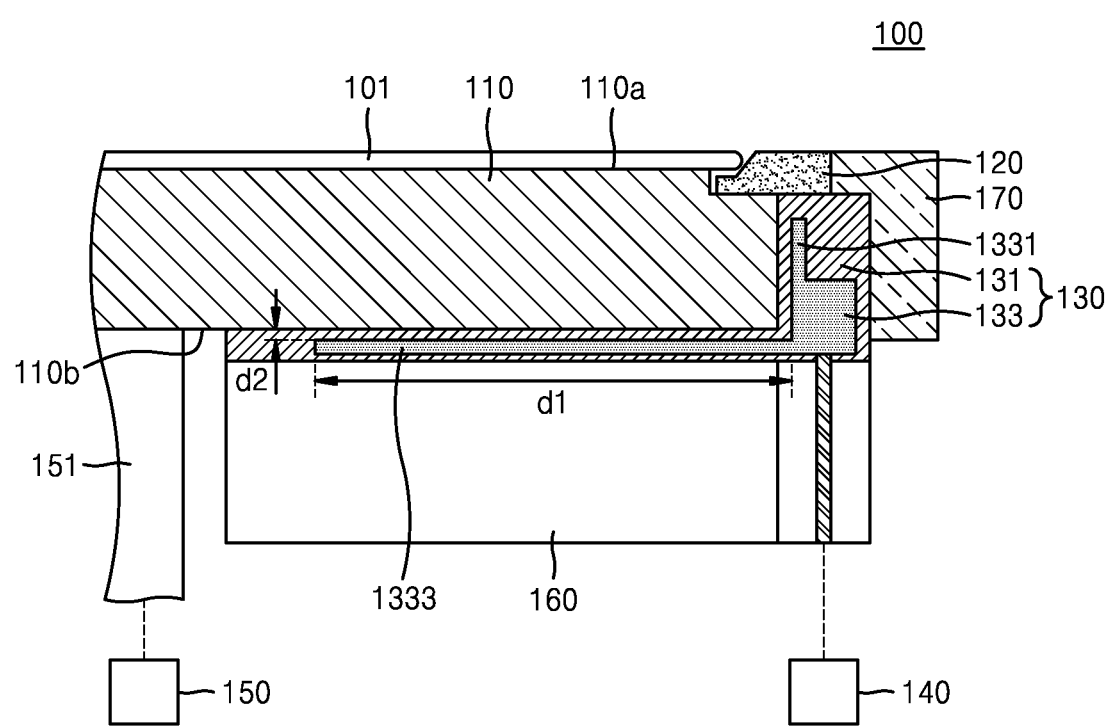
FIG. 1 is a schematic cross-sectional view illustrating a plasma processing apparatus according to an exemplary embodiment of the inventive concept.

Exemplary embodiments of the inventive concept will now be described more fully with reference to the accompanying drawings. Like reference numerals may refer to like elements throughout this application.

FIG. 1 is a schematic cross-sectional view illustrating a plasma processing apparatus according to an exemplary embodiment of the inventive concept.

Referring to FIG. 1, a plasma processing apparatus 100 may include a substrate chuck 110, a power supply unit 150, a focus ring 120, an edge block 130, and a control unit 140.

The substrate chuck 110 may be disposed on an insulating plate 160 and may support a substrate 101. The substrate chuck 110 may be an electrostatic chuck (ESC) configured to fix the substrate 101 by an electrostatic force. The substrate chuck 110 may be provided in a process chamber configured to perform a semiconductor manufacturing process using plasma, for example, an etch process, a deposition process, or a cleaning process.

The power supply unit 150 may supply radio frequency (RF) power to the substrate chuck 110. The power supply unit 150 may apply source power or bias power to the substrate chuck 110 through an RF road 151. The substrate chuck 110 may function as an electrode to generate plasma in the process chamber during plasma processing on the substrate 101.

The focus ring 120 may be disposed on the edge block 130 to surround a perimeter of the substrate 101. The focus ring 120 may surround the perimeter of the substrate 101 entirely or partially according to exemplary embodiments of the inventive concept. An inner side portion of the focus ring 120 may be disposed below an edge portion of the substrate 101 and may be supported by the substrate chuck 110. A perimeter of the focus ring 120 may be surrounded by an edge ring 170. The RF power applied to the substrate chuck 110 may be transmitted to the focus ring 120 through the substrate chuck 110 and/or the edge block 130. As the RF power is transmitted to the focus ring 120 through the substrate chuck 110 and/or the edge block 130, an electric field forming region in the process chamber may extend to the vicinity of the focus ring 120 and the plasma generated in the process chamber may be more expanded.

In exemplary embodiments of the inventive concept, the focus ring 120 may be made of a dielectric material, an insulating material, a semiconductor material, or a combination thereof. For example, the focus ring 120 may be made of silicon (Si), silicon carbide (SiC), carbon (C), or a combination thereof.

The edge block 130 may include a body 131 and an electrode 133.

The body 131 of the edge block 130 may cover at least a portion of a sidewall of the substrate chuck 110 and at least a portion of a second surface 110b of the substrate chuck 110 opposite to a first surface 110a of the substrate chuck 110 on which the substrate 101 is seated (or for supporting the substrate 101), as a part forming an appearance of the edge block 130. The body 131 of the edge block 130 may support the focus ring 120 thereon.

In exemplary embodiments of the inventive concept, the body 131 of the edge block 130 may be made of a dielectric material, an insulating material, a semiconductor material, or a combination thereof. For example, the body 131 of the edge block 130 may be made of alumina ($Al_2O_3$), quartz, yttrium oxide ($Y_2O_3$), silicon carbide (SiC), silicon oxide ($SiO_2$), or a combination thereof.

The electrode 133 may be disposed in the body 131 of the edge block 130 to be spaced apart from the substrate chuck 110. For example, the electrode 133 may be spaced apart from the substrate chuck 110 with a portion of the body 131 therebetween. When the RF power is applied to the substrate chuck 110, a predetermined capacitance may be formed between the substrate chuck 110 and the electrode 133, and the electrode 133 may be radio-frequency-coupled (RF coupled) with the substrate chuck 110.

In exemplary embodiments of the inventive concept, the electrode 133 may be made of aluminum (Al), copper (Cu), nickel (Ni), gold (Au), silver (Ag), or a combination thereof.

The electrode 133 may include a side electrode 1331 on a side well of the substrate chuck 110 and a bottom electrode 1333 on the second surface 110b of the substrate chuck 110.

The side electrode 1331 may be overlapped with the substrate chuck 110 in a radial direction of the substrate chuck 110. The side electrode 1331 may be spaced apart from the sidewall of the substrate chuck 110, and thus a capacitor may be formed between the side electrode 1331 and the sidewall of the substrate chuck 110.

The side electrode 1331 may extend along the sidewall of the substrate chuck 110. For example, the side electrode 1331 may extend substantially parallel to the sidewall of the substrate chuck 110. In other words, a distance between the side electrode 1331 and the substrate chuck 110 in the radial direction of the substrate chuck 110 may be constant.

In exemplary embodiments of the inventive concept, the side electrode 1331 may have a disk shape or a ring shape continuously extending along the sidewall (or a perimeter) of the substrate chuck 110.

In exemplary embodiments of the inventive concept, the side electrode 1331 may include a plurality of spaced sub-electrodes. For example, the plurality of spaced sub-electrodes constituting the side electrode 1331 may be radially spaced apart from one another.

The bottom electrode 1333 may be disposed on the second surface 110b of the substrate chuck 110 and may be overlapped with the substrate chuck 110 in a direction vertical (e.g., perpendicular) to the second surface 110b of the substrate chuck 110. The bottom electrode 1333 may be spaced apart from the second surface 110b of the substrate chuck 110, thus forming a capacitor between the bottom electrode 1333 and the second surface 110b of the substrate chuck 110.

The bottom electrode 1333 may extend along the second surface 110b of the substrate chuck 110. The bottom electrode 1333 may extend substantially parallel to the second surface 110b of the substrate chuck 110. In other words, the bottom electrode 1333 may be spaced a constant distance apart from the second surface 110b of the substrate chuck 110 in the direction vertical to the second surface 110b of the substrate chuck 110.

The bottom electrode 1333 may have a plate shape extending along the second surface 110b of the substrate chuck 110. In exemplary embodiments of the inventive concept. a thickness of the bottom electrode 1333 may range from about 10 mm to 50 mm.

In exemplary embodiments of the inventive concept, the bottom electrode 1333 may have a disk shape continuously extending along an edge of the substrate chuck 110.

In exemplary embodiments of the inventive concept, the bottom electrode 1333 may include a plurality of spaced sub-electrodes. For example, the plurality of spaced sub-electrodes constituting the bottom electrode 1333 may be radially spaced apart from one another along a circumference of the substrate chuck.

In exemplary embodiments of the inventive concept, the bottom electrode 1333 and the side electrode 1331 may be connected to each other. In exemplary embodiments of the inventive concept, the bottom electrode 1333 may be spaced apart from the side electrode 1331.

The capacitance of the capacitor formed between the electrode 133 of the edge block 130 and the substrate chuck 110 may vary depending on an area of the bottom electrode 1333, and/or the spaced distance between the bottom electrode 1333 and the substrate chuck 110. As the area of the bottom electrode 1333 increases and/or the spaced distance between the substrate chuck 110 and the bottom electrode 1333 decreases, the capacitance of the capacitor formed between the electrode 133 of the edge block 130 and the substrate chuck 110 may increase. Accordingly, the capacitance of the capacitor formed between the electrode 133 of the edge block 130 and the substrate chuck 110 may be adjusted by properly adjusting the area of the bottom electrode 1333 and/or the spaced distance between the bottom electrode 1333 and the substrate chuck 110.

In exemplary embodiments of the inventive concept, as a length d1 of the bottom electrode 1333 extending from the side electrode 1331 increases, an area of a surface of the bottom electrode 1333 facing the second surface 110b of the substrate chuck 110 may increase. In exemplary embodiments of the inventive concept, the length d1 of the bottom electrode 1333 extending from the side electrode 1331 may range from about 1 mm to 140 mm.

In exemplary embodiments of the inventive concept, a distance d2 spaced between the bottom electrode 1333 and the substrate chuck 110 may range from about 3 mm to 30 mm.

The control unit 140 may control an RF coupling operation between the substrate chuck 110 and the electrode 133 of the edge block 130. For example, the control unit 140 may include a variable capacitor connected to the electrode 133 of the edge block 130, and the electrode 133 of the edge block 130 may be connected to a ground through the variable capacitor. When the RF power is applied to the substrate chuck 110, the control unit 140 may adjust a magnitude of the RF power applied to the electrode 133 of the edge block 130. When the magnitude of the RF power applied to the electrode 133 of the edge block 130 is adjusted through the control of the RF coupling operation, a thickness of an edge plasma sheath formed in the vicinity of the edge portion of the substrate 101 and the focus ring 120 (for example, a distance between a surface of the focus ring 120 and the edge plasma sheath and a distance between a surface of the edge portion of the substrate 101 and the edge plasma sheath) may be adjusted. Hereinafter, controlling the thickness of the edge plasma sheath through the RF coupling operation will be described in detail with reference to FIGS. 3 and 4.

Figure 2:
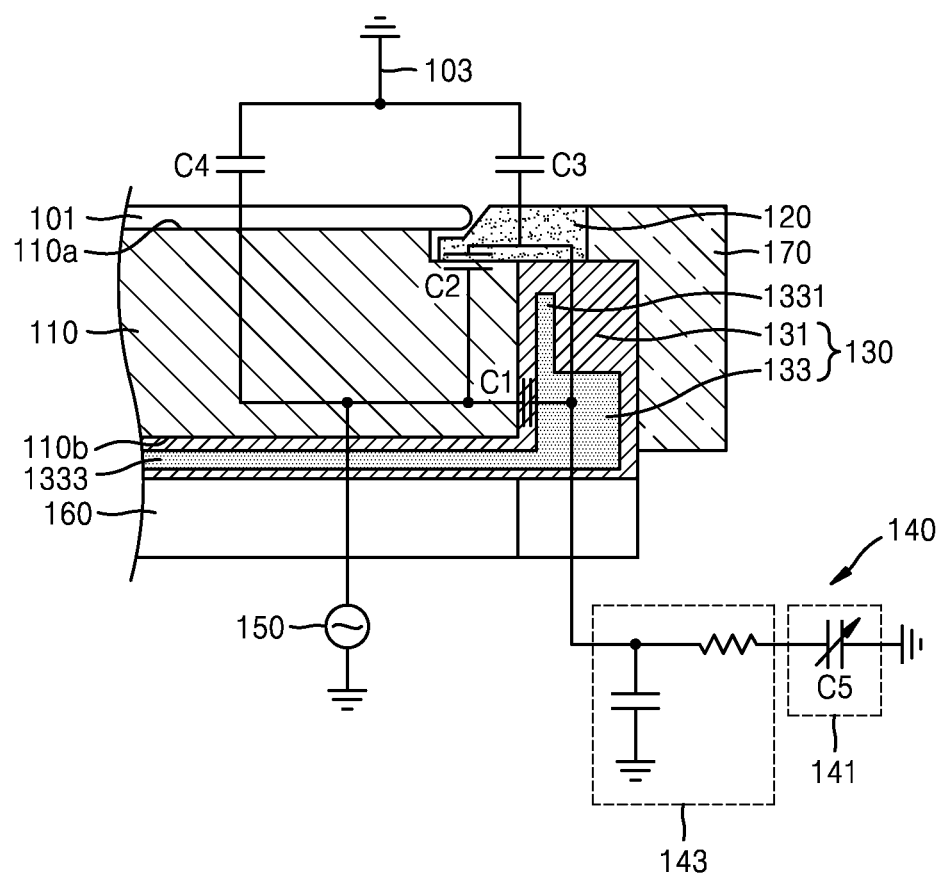
FIG. 2 is a circuit diagram illustrating control of a radio frequency (RF) coupling operation between an electrode of an edge block and a substrate chuck in the plasma processing apparatus of FIG. 1 according to an exemplary embodiment of the inventive concept.

FIG. 2 is a circuit diagram illustrating a control of an RF coupling operation between an electrode of an edge block and a substrate chuck in the plasma processing apparatus of FIG. 1 according to an exemplary embodiment of the inventive concept.

Referring to FIG. 2, a fourth capacitor C4 may be formed between the substrate 101 and a plasma 103, and a third capacitor C3 may be formed between the focus ring 120 and the plasma 103. A first capacitor C1 may be formed between the substrate chuck 110 and the electrode 133 of the edge block 130, and a second capacitor C2 may be formed between the substrate chuck 110 and the focus ring 120. The first capacitor C1 and the second capacitor C2 may be connected in parallel to each other, and a composite capacitor of the first capacitor C1 and the second capacitor C2 may be connected in series to the third capacitor C3.

The control unit 140 may include a variable capacitor C5 electrically connected to the electrode 133 of the edge block 130. The electrode 133 of the edge block 130 may be connected to the ground through the variable capacitor C5. The control unit 140 may adjust a capacitance of the variable capacitor C5 to control the RF coupling operation between the substrate chuck 110 and the edge block 130.

More specifically, the control unit 140 may reduce the capacitance of the variable capacitor C5, thus increasing an RF voltage applied to the electrode 133 of the edge block 130. As the RF voltage applied to the electrode 133 of the edge block 130 increases, an RF amplitude may increase in the vicinity of the focus ring 120, and the thickness of the edge plasma sheath may increase.

The control unit 140 may increase the capacitance of the variable capacitor C5, thus decreasing the RF voltage applied to the electrode 133 of the edge block 130 that is RF coupled with the substrate chuck 110. As the RF voltage applied to the electrode 133 of the edge block 130 decreases, the RF amplitude may decrease in the vicinity of the focus ring 120 and the thickness of the edge plasma sheath may decrease.

In general, the focus ring 120, which is a spare part, may be consumed over time. The change of the focus ring 120 over time may cause a change in a profile of the edge plasma sheath. For example, at the beginning of use of the focus ring 120, the edge plasma sheath may have usually substantially the same level as a central plasma sheath formed in the vicinity of a central portion of the substrate 101, but the edge plasma sheath may be changed to be lower than the central plasma sheath due to the change of the focus ring 120 over time. As the profile of the edge plasma sheath is changed, an incident direction of an ion incident on the edge portion of the substrate 101 may be changed, such that process characteristics at the edge portion of the substrate 101 may be nonuniform.

According to exemplary embodiments of the inventive concept, the control unit 140 may control the RF coupling operation between the substrate chuck 110 and the electrode 133 of the edge block 130, thus correcting the change in the edge plasma sheath due to the change of the focus ring 120 over time. For example, in response to the lowering of the level of the edge plasma sheath due to the change of the focus ring 120 over time, the control unit 140 may increase the RF voltage applied to the electrode 133 of the edge block 130 to control the profile of the edge plasma sheath, such that the edge plasma sheath may have substantially the same level as the central plasma sheath.

Since an amount of the change in the edge plasma sheath according to the consumption of the focus ring 120 is corrected, the process characteristics at the edge portion of the substrate 101 may be uniformly maintained, and the use period of the focus ring 120 may be increased, thus improving productivity.

The control unit 140 may include a frequency filter 143. The frequency filter 143 may be provided between the variable capacitor C5 and the electrode 133 of the edge block 130. The frequency filter 143 may allow a frequency of a specific band to selectively pass therethrough, such that the control of the RF coupling operation between the substrate chuck 110 and the electrode 133 of the edge block 130 may be performed at the frequency of the specific band. For example, the frequency filter 143 may include a low pass filter, a band pass filter, a high pass filter, and/or a band stop filter.

For example, the frequency filter 143 may be the low pass filter configured to allow a frequency of a low band to pass therethrough. In this case, when a relatively low RF power, for example a bias power, is supplied to the substrate chuck 110 through the power supply unit 150, the control unit 140 may control the operation of the variable capacitor C5 to control the RF coupling operation. In contrast, when a relatively high RF power, for example, a source power, is supplied to the substrate chuck 110, the RF power may not pass the frequency filter 143, and thus the control of the RF coupling operation may not be performed.

Figure 3:
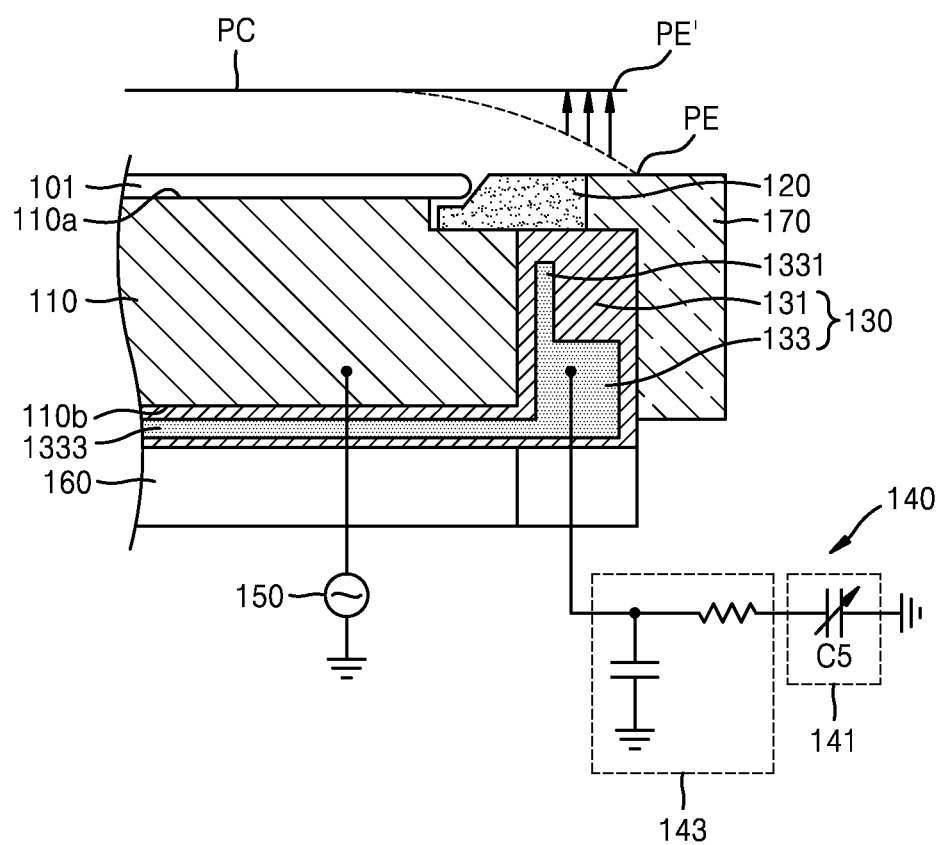
FIGS. 3 and 4 are views illustrating a method of controlling an edge plasma sheath according to exemplary embodiments of the inventive concept.
Figure 4:
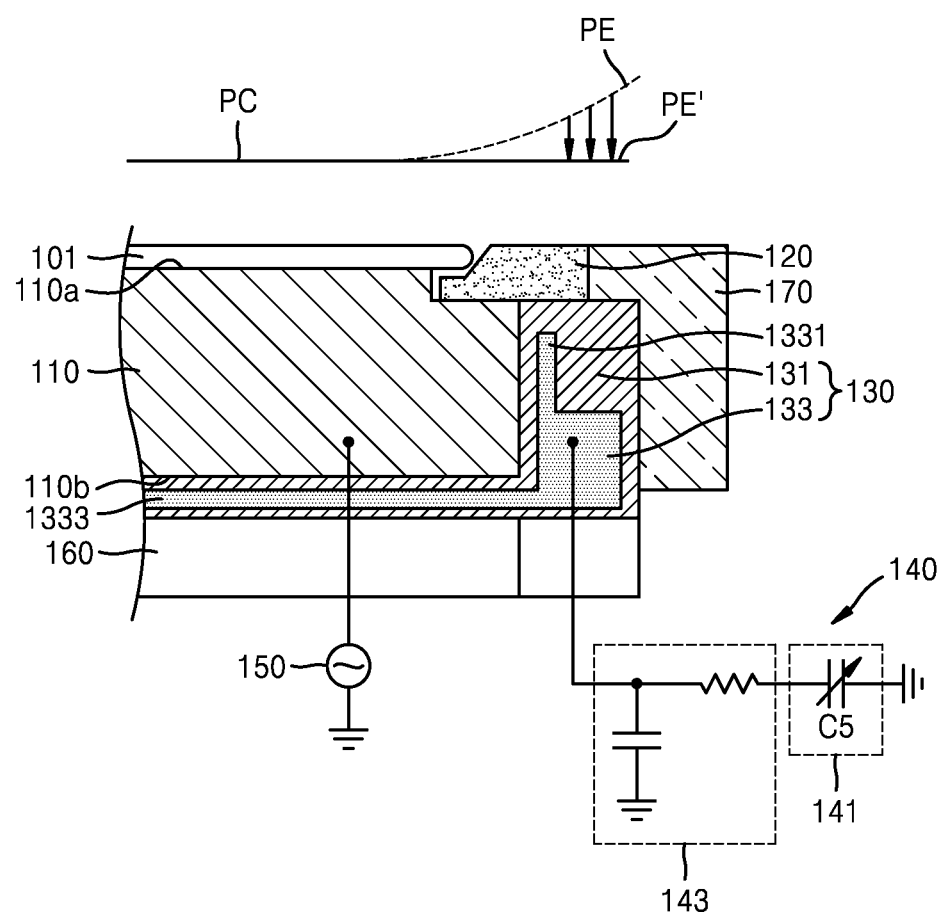

FIGS. 3 and 4 are views illustrating a method of controlling an edge plasma sheath according to exemplary embodiments of the inventive concept.

Referring to FIG. 3, a central plasma sheath PC may have a profile substantially parallel to a surface of the substrate 101, and an edge plasma sheath PE may have a profile gradually lowering in a radial direction.

At this time, the control unit 140 may reduce the capacitance of the variable capacitor C5. As described with reference to FIG. 2, as the capacitance of the variable capacitor C5 decreases, the RF voltage applied to the electrode 133 of the edge block 130 may increase, and thus a thickness of an edge plasma sheath PE' may increase. As the thickness of the edge plasma sheath PE' increases, the edge plasma sheath PE' may be adjusted to have a profile parallel to or similar to the profile of the central plasma sheath PC.

Referring to FIG. 4, the central plasma sheath PC may have a profile substantially parallel to the surface of the substrate 101, and the edge plasma sheath PE may have a profile gradually rising in the radial direction.

At this time, the control unit 140 may increase the capacitance of the variable capacitor C5. As described with reference to FIG. 2, as the capacitance of the variable capacitor C5 increases, the RF voltage applied to the electrode 133 of the edge block 130 may decrease, and thus the thickness of the edge plasma sheath PE' may decrease. As the thickness of the edge plasma sheath PE' decreases, the edge plasma sheath PE' may be adjusted to have a profile parallel to or similar to the profile of the central plasma sheath PC.

As shown in FIGS. 3 and 4, the profile of the edge plasma sheath PE' affecting the process characteristics at the edge portion of the substrate 101 may be adjusted through the control of the RF coupling operation between the substrate chuck 110 and the electrode 133 of the edge block 130. For example, ions may be incident on the edge portion of the substrate 101 in a direction vertical to the surface of the substrate 101 by adjusting the edge plasma sheath PE' to have a profile substantially parallel to the surface of the substrate 101. As the profile of the edge plasma sheath PE' affecting the process characteristics at the edge portion of the substrate 101 is adjusted, the process distribution between the edge portion of the substrate 101 and the central portion of the substrate 101 may be reduced.

According to exemplary embodiments of the inventive concept, referring to FIGS. 2, 3, and 4, since the electrode 133 of the edge block 130 includes the side electrode 1331 on the sidewall of the substrate chuck 110 and the bottom electrode 1333 on the second surface 110b of the substrate chuck 110, the first capacitor C1 between the substrate chuck 110 and the edge block 130 may have a relatively great capacitance and the RF coupling between the substrate chuck 110 and the edge block 130 may be strengthened. As the RF coupling between the substrate chuck 110 and the edge block 130 is strengthened, the ability to adjust the edge plasma sheath PE' by controlling the RF coupling operation between the substrate chuck 110 and the electrode 133 of the edge block 130 may be increased.

Figure 5:
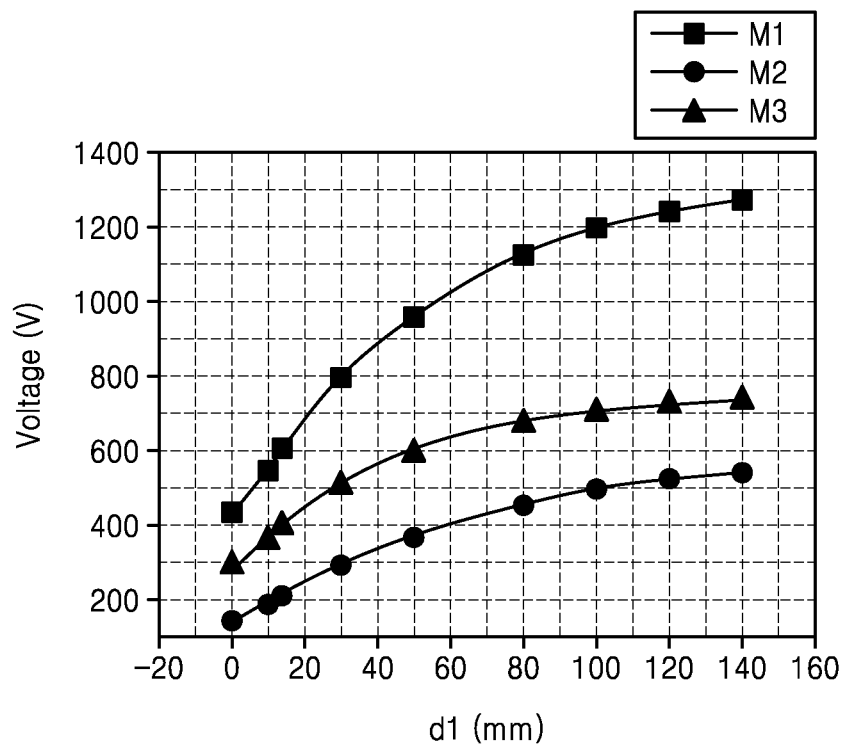
FIG. 5 is a graph showing a variation in an RF voltage applied to an electrode of an edge block depending on a length of a bottom electrode extending from a side electrode in the plasma processing apparatus of FIG. 1 according to an exemplary embodiment of the inventive concept.

FIG. 5 is a graph showing a variation in an RF voltage applied to an electrode of an edge block depending on a length of a bottom electrode extending from a side electrode in the plasma processing apparatus of FIG. 1 according to an exemplary embodiment of the inventive concept.

Referring to FIGS. 1, 2 and 5, a graph shown in FIG. 5 represents a first profile M1 of a first operation mode in which the variable capacitor C5 of FIG. 2 has a relatively low capacitance, a second profile M2 of a second operation mode in which the variable capacitor C5 of FIG. 2 has a relatively high capacitance, and a third profile M3 corresponding to a difference between the first profile M1 and the second profile M2.

As represented by the first profile M1 and the second profile M2, the RF voltage applied to the electrode 133 of the edge block 130 increases as the length d1 (refer to FIG. 1) of the bottom electrode 1333 increases. The capacitance of the first capacitor C1 may increase as the length d1 (refer to FIG. 1) of the bottom electrode 1333 increases, and thus the RF coupling between the substrate chuck 110 and the electrode 133 of the edge block 130 may be strengthened more and more.

As represented by the third profile M3, the difference between the RF voltage applied to the electrode 133 of the edge block 130 in the first operation mode and the RF voltage applied to the electrode 133 of the edge block 130 in the second operation mode increases as the length d1 (refer to FIG. 1) of the bottom electrode 1333 increases. The capacitance of the variable capacitor C5 is varied in the same range, and the difference between the RF voltage in the first mode and the RF voltage in the second mode increases as the capacitance of the first capacitor C1 increases. The difference between the RF voltage in the first operation mode and the RF voltage in the second operation mode may be proportional to a control range of the edge plasma sheath using the control of the RF coupling operation between the substrate chuck 110 and the electrode 133 of the edge block 130, and thus the plasma processing apparatus according to exemplary embodiments of the inventive concept may effectively control the edge plasma sheath.

Figure 6:
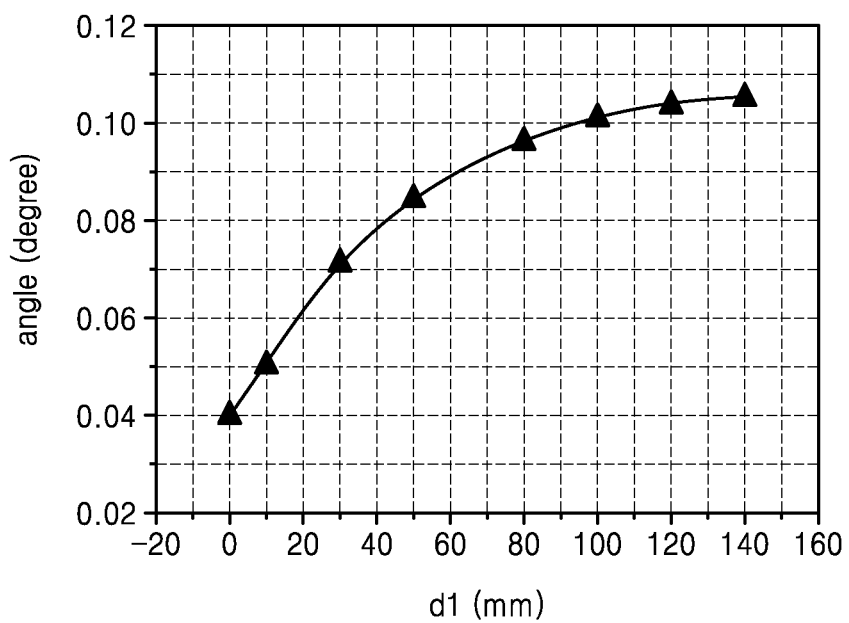
FIG. 6 is a graph showing a variation in an angle between a reference direction and a progressing direction of an ion depending on the length of the bottom electrode extending from the side electrode in the plasma processing apparatus of FIG. 1 according to an exemplary embodiment of the inventive concept.

FIG. 6 is a graph showing a variation in an angle between a reference direction and a progressing direction of an ion depending on the length of the bottom electrode extending from the side electrode in the plasma processing apparatus of FIG. 1 according to an exemplary embodiment of the inventive concept.

Referring to FIGS. 1, 2, and 6, a graph shown in FIG. 6 shows a variation in an angle between an arbitrary reference direction and a progressing direction of an ion depending on the length d1 of the bottom electrode 1333 (refer to FIG. 1) when the RF voltage corresponding to the third profile M3 of FIG. 5 is applied. As shown in FIG. 6, the progressing direction of the ion tilts more and more with respect to the reference direction as the length d1 of the bottom electrode 1333 increases. In the plasma processing apparatus according to exemplary embodiments of the inventive concept, since the first capacitor C1 between the substrate chuck 110 and the electrode 133 of the edge block 130 is formed to have a relatively high capacitance, an incident angle of an ion incident on the substrate 101 may be adjusted in a wider range.

Figure 7:
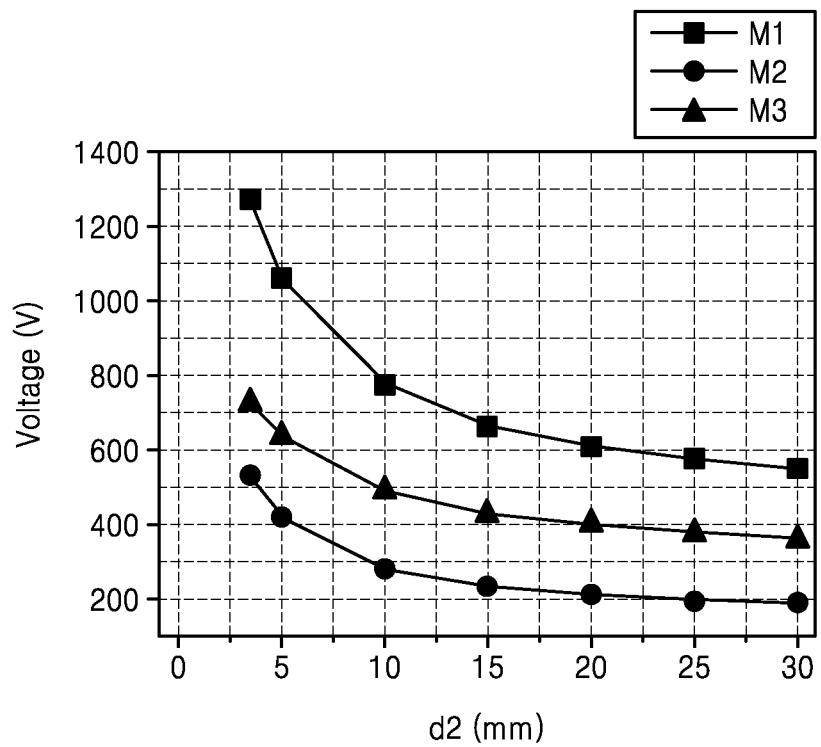
FIG. 7 is a graph showing a variation in an RF voltage applied to the electrode of the edge block depending on a distance between the bottom electrode and a substrate chuck in the plasma processing apparatus of FIG. 1 according to an exemplary embodiment of the inventive concept.

FIG. 7 is a graph showing a variation in an RF voltage applied to the electrode of the edge block depending on a distance between the bottom electrode and a substrate chuck in the plasma processing apparatus of FIG. 1 according to an exemplary embodiment of the inventive concept.

Referring to FIGS. 1, 2, and 7, a graph shown in FIG. 7 represents the first profile M1 of the first operation mode in which the variable capacitor C5 of FIG. 2 has a relatively low capacitance, the second profile M2 of the second operation mode in which the variable capacitor C5 of FIG. 2 has a relatively high capacitance, and the third profile M3 corresponding to the difference between the first profile M1 and the second profile M2.

As represented by the first profile M1 and the second profile M2, the RF voltage applied to the electrode 133 of the edge block 130 increases as the distance d2 (refer to FIG. 1)

between the bottom electrode 1333 and the substrate chuck 110 decreases. The capacitance of the first capacitor C1 between the substrate chuck 110 and the electrode 133 of the edge block 130 may increase as the bottom electrode 1333 gets closer to the substrate chuck 110, and thus the RF coupling between the substrate chuck 110 and the electrode 133 of the edge block 130 may be strengthened more and more.

As represented by the third profile M3, the difference between the RF voltage applied to the electrode 133 of the edge block 130 in the first operation mode and the RF voltage applied to the electrode 133 of the edge block 130 in the second operation mode increases as the distance d2 between the bottom electrode 1333 and the substrate chuck 110 decreases. Since the first capacitor C1 between the substrate chuck 110 and the electrode 133 of the edge block 130 is formed to have a relatively high capacitance in the plasma processing apparatus according to exemplary embodiments of the inventive concept, the edge plasma sheath may be effectively controlled.

Figure 8:
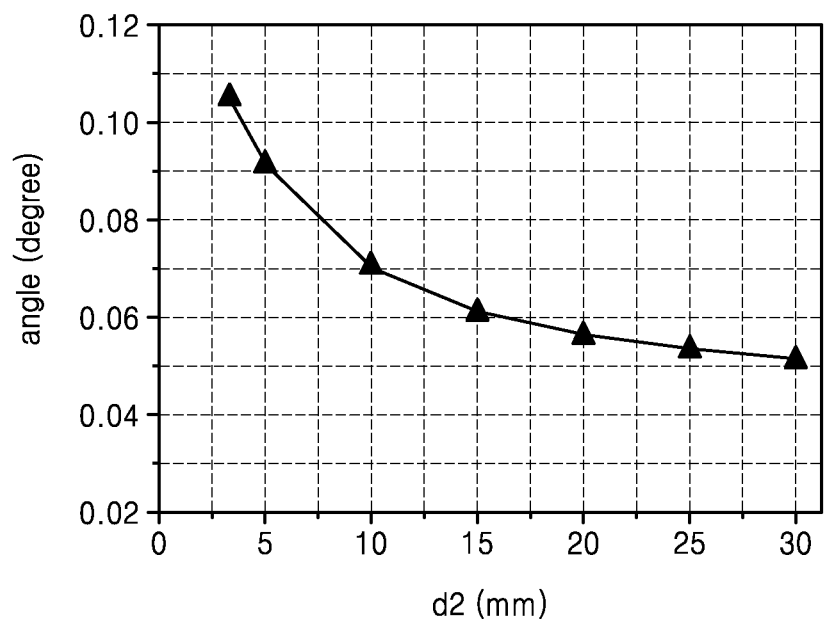
FIG. 8 is a graph showing a variation in an angle between the reference direction and the progressing direction of an ion depending on the distance between the bottom electrode and the substrate chuck in the plasma processing apparatus of FIG. 1 according to an exemplary embodiment of the inventive concept.

FIG. 8 is a graph showing a variation in an angle between the reference direction and the progressing direction of an ion depending on the distance between the bottom electrode and the substrate chuck in the plasma processing apparatus of FIG. 1 according to an exemplary embodiment of the inventive concept.

Referring to FIGS. 1, 2, and 8, a graph shown in FIG. 8 shows a variation in an incident angle of an ion depending on the distance d2 (refer to FIG. 1) between the bottom electrode 1333 and the substrate chuck 110 when the RF voltage corresponding to the third profile M3 of FIG. 7 is applied. As shown in FIG. 8, the progressing direction of the ion tilts more and more with respect to the arbitrary reference direction as the distance d2 (refer to FIG. 1) between the bottom electrode 1333 and the substrate chuck 110 decreases. In the plasma processing apparatus according to exemplary embodiments of the inventive concept, since the first capacitor C1 between the substrate chuck 110 and the electrode 133 of the edge block 130 is formed to have a relatively high capacitance, an incident angle of an ion incident on the substrate 101 may be adjusted in a wider range.

Figure 9:
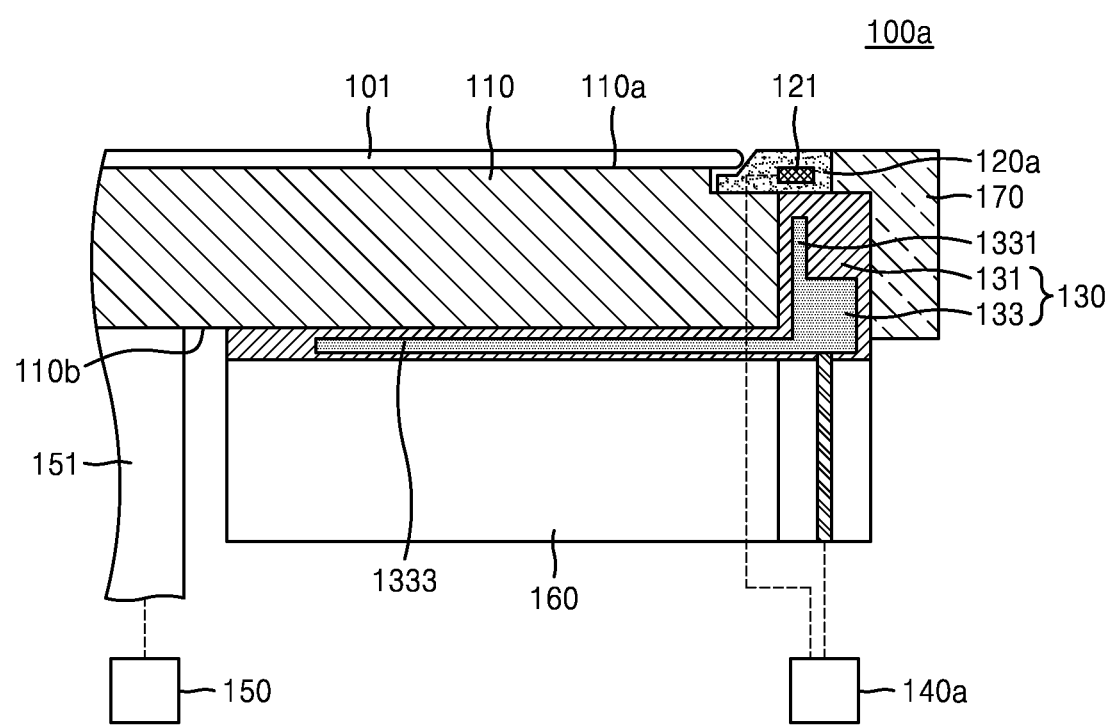
FIG. 9 is a schematic cross-sectional view illustrating a plasma processing apparatus according to an exemplary embodiment of the inventive concept.

FIG. 9 is a schematic cross-sectional view illustrating a plasma processing apparatus according to an exemplary embodiment of the inventive concept. A plasma processing apparatus 100a of FIG. 9 may be substantially the same as the plasma processing apparatus 100 of FIG. 1, except that the focus ring 120 includes a focus ring electrode 121. The same elements as those of the above-described exemplary embodiments are referred to by the same numerals, and a description thereof will be omitted.

Referring to FIG. 9, the focus ring 120 may include the focus ring electrode 121 therein. For example, the focus ring electrode 121 may be made of aluminum (Al), copper (Cu), nickel (Ni), gold (Au), silver (Ag), or a combination thereof.

A control unit 140a may supply power to the focus ring electrode 121 to adjust the edge plasma sheath. For example, the control unit 140a may be configured to supply RF power or direct current (DC) power to the focus ring electrode 121.

When the edge plasma sheath has a profile gradually lowering in the radial direction, as shown in FIG. 3, the control unit 140a may increase the thickness of the edge plasma sheath by increasing the power applied to the focus ring electrode 121. Thus, the edge plasma sheath may be adjusted to have the profile parallel to or similar to the central plasma sheath.

When the edge plasma sheath has a profile gradually rising in the radial direction, as shown in FIG. 4, the control unit 140a may reduce the thickness of the edge plasma sheath by reducing the power applied to the focus ring electrode 121. Thus, the edge plasma sheath may be adjusted to have the profile parallel to or similar to the central plasma sheath.

In exemplary embodiments of the inventive concept, the control unit 140a may adjust the edge plasma sheath by adjusting the power supplied to the focus ring electrode 121 along with the control of the RF coupling operation between the substrate chuck 110 and the edge block 130. The control unit 140a may adjust the edge plasma sheath by adjusting the power supplied to the focus ring electrode 121 apart from the control of the RF coupling operation between the substrate chuck 110 and the edge block 130.

Figure 10:
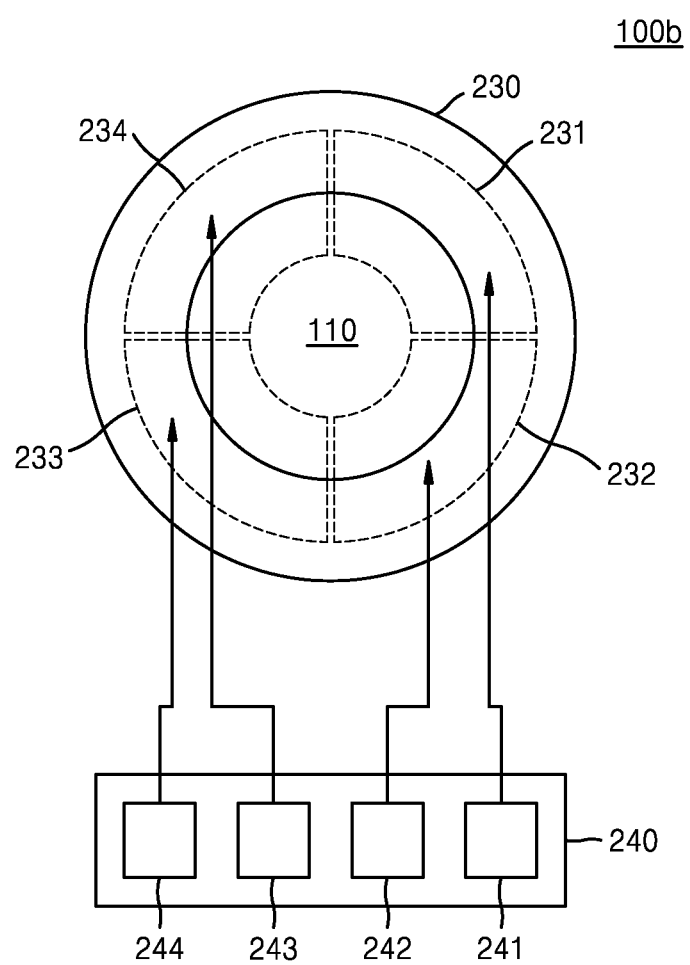
FIGS. 10 and 11 are schematic views illustrating a plasma processing apparatus according to exemplary embodiments of the inventive concept.
Figure 11:
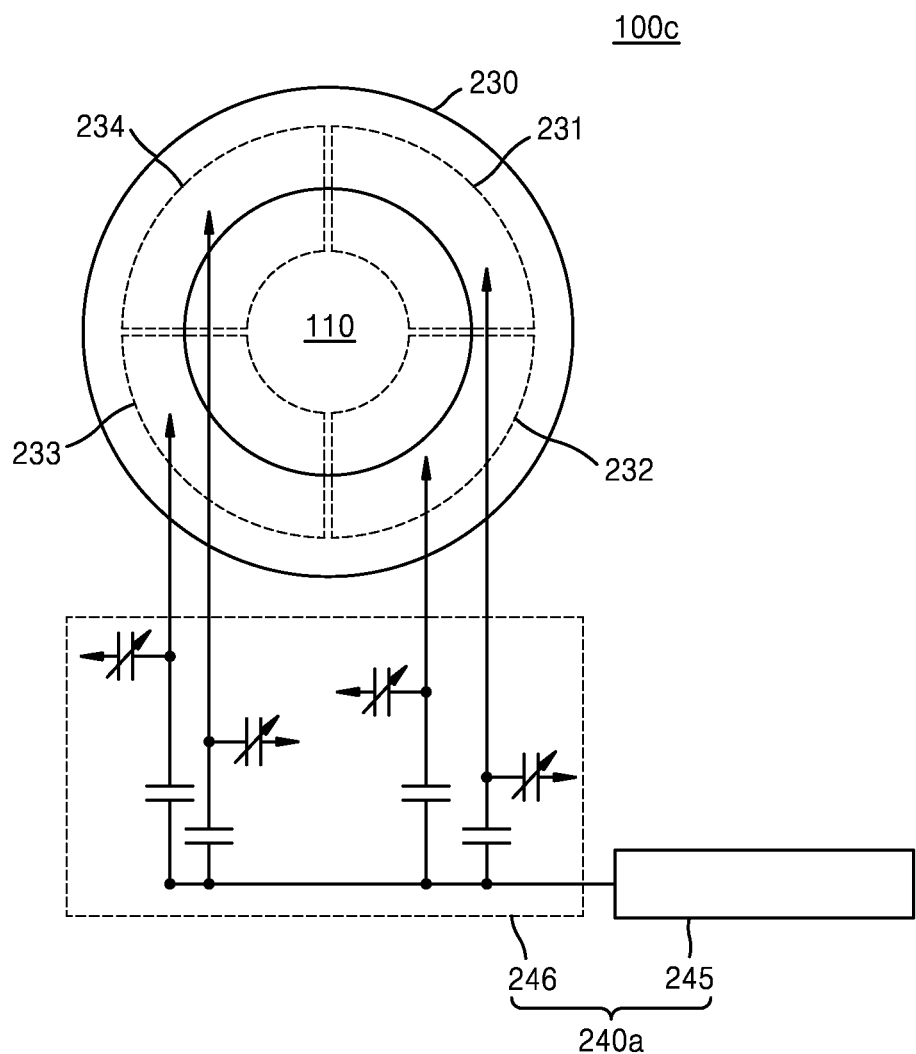

FIGS. 10 and 11 are schematic views illustrating a plasma processing apparatus according to exemplary embodiments of the inventive concept.

Referring to FIG. 10, in a plasma processing apparatus 100b according to exemplary embodiments of the inventive concept, an edge block 230 may include a plurality of radially spaced sub-electrodes. For example, an electrode of the edge block 230 may include a first sub-electrode 231, a second sub-electrode 232, a third sub-electrode 233, and a fourth sub-electrode 234 that are radially spaced apart from one another. Each of the first sub-electrode 231, the second sub-electrode 232, the third sub-electrode 233, and the fourth sub-electrode 234 may include the side electrode (refer to 1331 of FIG. 1) on the sidewall of the substrate chuck (refer to 110 of FIG. 1) and the bottom electrode (refer to 1333 of FIG. 1) on the second surface (refer to 110b of FIG. 1) of the substrate chuck (refer to 110 of FIG. 1) as described above.

In the exemplary embodiment of FIG. 10, the edge block 230 may include four radially spaced four sub-electrodes, but the inventive concept is not limited thereto. For example, the edge block 230 may include two, three, or five or more radially spaced sub-electrodes.

In exemplary embodiments of the inventive concept. the first sub-electrode 231 may be connected to a ground through a first variable capacitor, the second sub-electrode 232 may be connected to the ground through a second variable capacitor, the third sub-electrode 233 may be connected to the ground through a third variable capacitor, and the fourth sub-electrode 234 may be connected to the ground through a fourth variable capacitor.

At this time, a control unit 240 may be configured to control the RF coupling operation between the substrate chuck 110 and each of the first sub-electrode 231, the second sub-electrode 232, the third sub-electrode 233, and the fourth sub-electrode 234. The RF coupling operation between the substrate chuck 110 and each of the first sub-electrode 231, the second sub-electrode 232, the third sub-electrode 233, and the fourth sub-electrode 234 may be independently controlled.

For example, the control unit 240 may include a first circuit controller 241 configured to adjust a capacitance of the first variable capacitor connected to the first sub-electrode 231, a second circuit controller 242 configured to adjust a capacitance of the second variable capacitor connected to the second sub-electrode 232, a third circuit controller 243 configured to adjust a capacitance of the third variable capacitor connected to the third sub-electrode 233, and a fourth circuit controller 244 configured to adjust a capacitance of the fourth variable capacitor connected to the fourth sub-electrode 234. The capacitance of each of the first to fourth variable capacitors may be independently adjusted using a corresponding one of the first to fourth circuit controllers 241, 242, 243, and 244, and the RF voltage applied to each of the first to fourth sub-electrodes 231, 232, 233, and 234 may be independently adjusted.

Since the RF coupling operation between the substrate chuck 110 and each of the first to fourth sub-electrodes 231, 232, 233, and 234 in the edge block 230 is independently controlled, a process control may be locally performed at a specific region of the edge portion of the substrate (refer to 101 of FIG. 1).

For example, an etch rate at a first edge portion of the substrate (refer to 101 of FIG. 1) adjacent the first sub-electrode 231 may be greater than an etch rate at a second edge portion of the substrate (refer to 101 of FIG. 1) adjacent the second sub-electrode 232, an etch rate at a third edge portion of the substrate (refer to 101 of FIG. 1) adjacent the third sub-electrode 233, and an etch rate at a fourth edge portion of the substrate (refer to 101 of FIG. 1) adjacent the fourth sub-electrode 234. To remove or reduce such an asymmetric process distribution, the control unit 240 may increase the RF voltage applied to the first sub-electrode 231 to lower the etch rate at the first edge portion of the substrate (refer to 101 of FIG. 1) and may reduce the RF voltage applied to each of the second to fourth sub-electrodes 232, 233, and 234 to increase the etch rate at the second to fourth edge portions of the substrate (refer to 101 of FIG. 1). Accordingly, the etch rate at the entire edge portion of the substrate (refer to 101 of FIG. 1) may be uniformly controlled.

Referring to FIG. 11, in a plasma processing apparatus 100c according to an exemplary embodiment of the inventive concept, a control unit 240a may include a current splitter 246 and a circuit controller 245 configured to control an operation of the current splitter 246. The current splitter 246 may be provided between the first to fourth sub-electrodes 231, 232, 233, and 234 of the edge block 230 and the circuit controller 245.

For example, the current splitter 246 may include the first variable capacitor connected to the first sub-electrode 231, the second variable capacitor connected to the second sub-electrode 232, the third variable capacitor connected to the third sub-electrode 233, and the fourth variable capacitor connected to the fourth sub-electrode 234. At that time, the circuit controller 245 may apply an operation signal, for controlling an operation of each of the first to fourth variable capacitors, to the current splitter 246 to distribute current to each of the first to fourth sub-electrodes 231, 232, 233, and 234.

The control unit 240a may distribute the current to each of the first to fourth sub-electrodes 231, 232, 233, and 234 through the current splitter 246, such that the RF coupling operation between each of the first to fourth sub-electrodes 231, 232, 233, and 234 and the substrate chuck 110 may be independently controlled.

Figure 12:
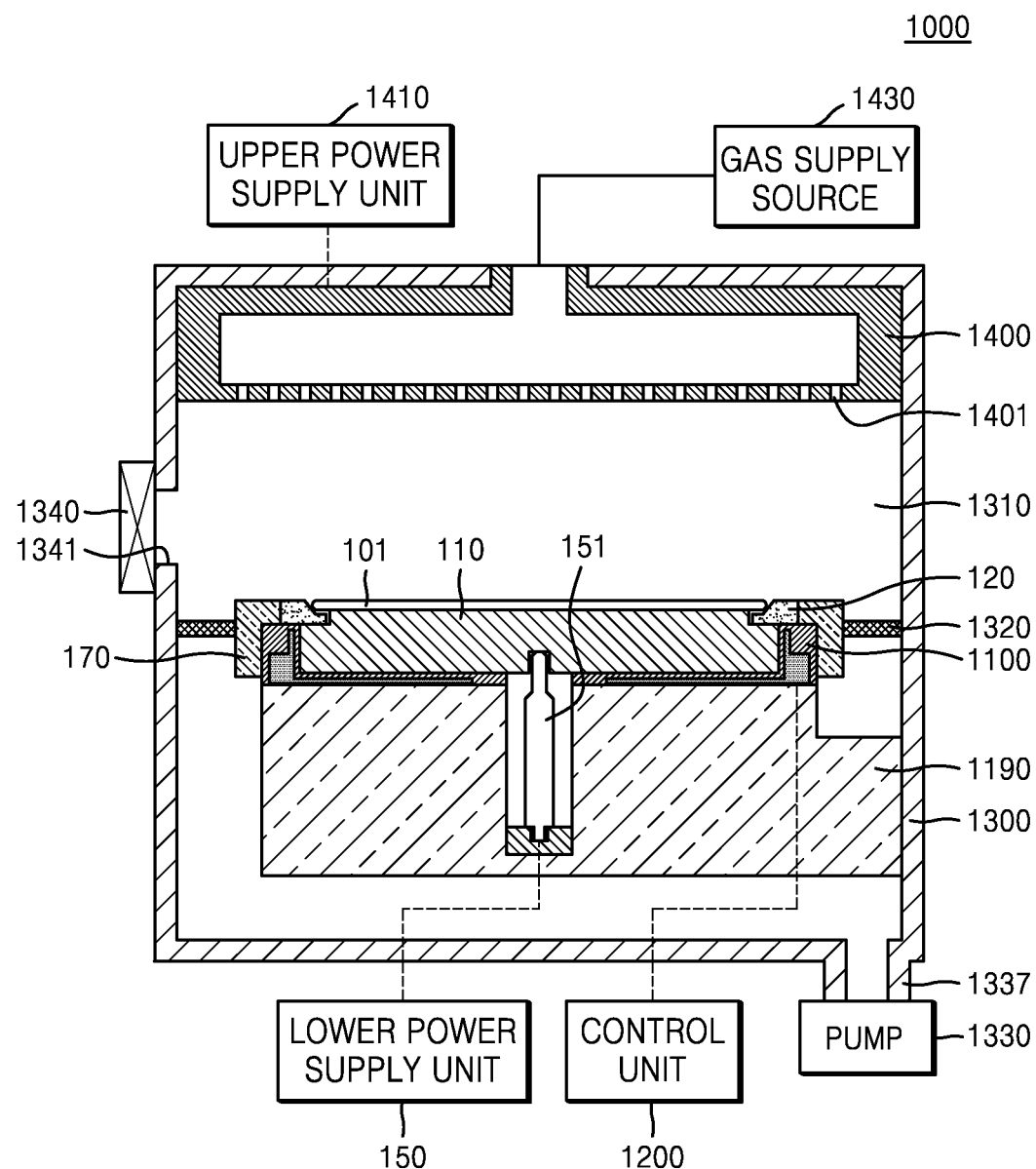
FIG. 12 is a schematic cross-sectional view illustrating a plasma processing apparatus according to an exemplary embodiment of the inventive concept.

FIG. 12 is a schematic cross-sectional view illustrating a plasma processing apparatus according to exemplary embodiments of the inventive concept.

Referring to FIG. 12, a plasma processing apparatus 1000 according to an exemplary embodiment of the inventive concept may be a capacitively coupled plasma etch apparatus, as an example. However, the inventive concept is not limited thereto. In exemplary embodiments of the inventive concept, the plasma processing apparatus 1000 may be an inductively coupled plasma etch apparatus or a plasma deposition apparatus.

The plasma processing apparatus 1000 may be a plasma etch apparatus for processing the substrate 101, for example, performing a plasma etch process, in a process chamber 1300. The substrate 101 may be a wafer, for example, a silicon wafer. The process chamber 1300 may be a chamber including an internal space 1310, for example, a plasma chamber. A material layer, for example, an oxide layer or a nitride layer may be formed on the substrate 101.

The plasma processing apparatus 1000 may include the substrate chuck 110 provided on a supporter 1190 and on which the substrate 101 may be mounted. The substrate chuck 110 may be an electrostatic chuck for fixing the substrate 101 by an electrostatic force.

The substrate chuck 110 may be connected to a lower power supply unit 150 and may function as a lower electrode for generating plasma. For example, the lower power supply unit 150 may generate RF power, for example, bias power. The RF power generated from the lower power supply unit 150 may be supplied to the substrate chuck 110 through an impedance matcher.

A baffle plate 1320 may be provided between the substrate chuck 110 and an inner sidewall of the process chamber 1300. An exhaust line 1337 may be provided on a lower surface of the process chamber 1300 and may be connected to a vacuum pump 1330. A gate valve 1340 for opening and closing an opening 1341 for carrying in and carrying out the substrate 101 may be provided on an outer sidewall of the process chamber 1300.

An upper electrode 1400 may be provided on a ceiling of the process chamber 1300 and may be spaced upward apart from the substrate chuck 110. The upper electrode 1400 may be connected to an upper power supply unit 1410. The upper power supply unit 1410 may generate RF power and may supply the RF power to the upper electrode 1400 through an impedance matcher. The upper electrode 1400 may be connected to a gas supply source 1430 for supplying a process gas. For example, the upper electrode 1400 may be a showerhead electrode. The process gas supplied from the gas supply source 1430 may be sprayed into the internal space 1310 of the process chamber 1300 through a jet hole 1401 of the upper electrode 1400.

The plasma processing apparatus 1000 may include the focus ring 120 for surrounding a perimeter of the substrate 101 mounted on the substrate chuck 110 and an edge block 1100 below the focus ring 120. The edge block 1100 may include the edge blocks 130 and 230 described with reference to FIGS. 1 to 11. The plasma processing apparatus 1000 may include a control unit 1200. The control unit 1200 may include the control units 140, 140a, 240, and 240a described with reference to FIGS. 1 to 11 and may control an RF coupling operation between the substrate chuck 110 and the edge block 1100 to adjust an edge plasma sheath.

According to exemplary embodiments of the inventive concept, in the case in which the non-uniformity in the process characteristics between a central portion of the substrate 101 and an edge portion of the substrate 101 is detected, a process distribution of the substrate 101 may be reduced or removed through the control of the RF coupling operation between an electrode of the edge block 1100 and the substrate chuck 110. In the case in which the non-uniformity in a plasma state between the central portion of the substrate 101 and the edge portion of the substrate 101 is monitored by a monitoring device, such as a plasma sensor, the plasma state in the vicinity of the central portion of the substrate 101 and in the vicinity of the edge portion of the substrate 101 may be uniformly controlled through the control of the RF coupling operation between the substrate chuck 110 and the electrode (refer to 133 of FIG. 1) of the edge block 1100.

According to exemplary embodiments of the inventive concept, in the case in which an asymmetric process distribution at the edge portion of the substrate 101 is detected, the asymmetric process distribution may be reduced or removed by separately controlling the RF coupling operation between each of the plurality of sub-electrodes in the edge block 1100 and the substrate chuck 110. In the case in which the monitoring device, for example, the plasma sensor, determines that the plasma state on the edge portion of the substrate 101 is asymmetric, the plasma state on the edge portion of the substrate 101 may be controlled to be uniform by separately controlling the RF coupling operation between the substrate chuck 110 and each of the plurality of sub-electrodes in the edge block 1100.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A plasma processing apparatus comprising:
   a substrate chuck having a first surface that supports a substrate, a second surface opposite to and extending parallel to the first surface, and a sidewall extending perpendicularly to the first surface and the second surface and connecting the first surface and the second surface;
   a focus ring that surrounds a perimeter of the substrate; and
   an edge block that supports the focus ring, wherein the edge block includes a body, a side electrode disposed on the sidewall of the substrate chuck, and a bottom electrode disposed on the second surface of the substrate chuck and connected to the side electrode, the side electrode spaced apart from and extending parallel to the sidewall of the substrate chuck and the bottom electrode spaced apart from and extending parallel to the second surface of the substrate chuck,
   wherein the body is disposed between the side electrode and the substrate chuck and between the bottom electrode and the substrate chuck,
   wherein the bottom electrode has a plate shape that extends along the second surface of the substrate chuck;
   wherein a distance between the bottom electrode and the second surface of the substrate chuck is in a range of about 3 mm to about 30 mm,
   wherein the side electrode is laterally spaced apart from an edge of the substrate so as not to overlap the substrate, and
   wherein at least a part of the bottom electrode overlaps the substrate.

2. The plasma processing apparatus of claim 1, wherein the body includes a dielectric material,
   wherein the body is disposed between the side electrode and the substrate chuck and between the bottom electrode and the substrate chuck.

3. The plasma processing apparatus of claim 1, further comprising a variable capacitor,
   wherein the side electrode and the bottom electrode are connected to a ground through the variable capacitor.

4. The plasma processing apparatus of claim 3, further comprising a frequency filter disposed between the side electrode and the variable capacitor and between the bottom electrode and the variable capacitor.

5. The plasma processing apparatus of claim 1, wherein the side electrode has a ring shape that extends along the sidewall of the substrate chuck.

6. The plasma processing apparatus of claim 1, wherein the side electrode includes a plurality of radially spaced sub-electrodes.

7. The plasma processing apparatus of claim 6, further comprising a variable capacitor,
   wherein each of the plurality of radially spaced sub-electrodes of the side electrode is connected to a ground through the variable capacitor.

8. The plasma processing apparatus of claim 1, wherein the bottom electrode includes a plurality of radially spaced sub-electrodes.

9. The plasma processing apparatus of claim 8, further comprising a variable capacitor,
   wherein each of the plurality of radially spaced sub-electrodes of the bottom electrode is connected to a ground through the variable capacitor.

10. The plasma processing apparatus of claim 1, further comprising a focus ring electrode provided in the focus ring and configured to receive power.

11. The plasma processing apparatus of claim 1, wherein, in a cross-section of the plasma processing apparatus, a length of the bottom electrode extending from the side electrode is a range of about 1 mm to about 140 mm.

12. A plasma processing apparatus comprising:
    a substrate chuck having a first surface that supports a substrate, a second surface opposite to and extending parallel to the first surface, and a sidewall extending perpendicularly to the first surface and the second surface and connecting the first surface and the second surface;
    a focus ring that surrounds a perimeter of the substrate;
    an edge block including a body and a first electrode in the body, wherein the body covers at least a portion of the sidewall and the second surface of the substrate chuck, and the first electrode includes a side electrode disposed on the sidewall of the substrate chuck and a bottom electrode disposed on the second surface of the substrate chuck and connected to the side electrode;
    a power supply that supplies radio frequency (RF) power to the substrate chuck; and
    a first variable capacitor that is connected to the first electrode,
    wherein the side electrode extends parallel to the sidewall of the substrate chuck,
    wherein the body is disposed between the side electrode and the substrate chuck and between the bottom electrode and the substrate chuck,
    wherein the bottom electrode has a plate shape that extends along the second surface of the substrate chuck,
    wherein a distance between the bottom electrode and the second surface of the substrate chuck is in a range of about 3 mm to about 30 mm,
    wherein the side electrode is laterally spaced apart from an edge of the substrate so as not to overlap the substrate, and
    wherein at least a part of the bottom electrode overlaps the substrate.

13. The plasma processing apparatus of claim 12, further comprising a low pass filter disposed between the first variable capacitor and the first electrode.

14. The plasma processing apparatus of claim 12, wherein the edge block further includes a second electrode.

15. The plasma processing apparatus of claim 14, further comprising a second variable capacitor that is connected to the second electrode,
   wherein an RF coupling between the substrate chuck and the first electrode is adjusted by adjusting a capacitance of the first variable capacitor, and an RF coupling between the substrate chuck and the second electrode is adjusted by adjusting a capacitance of the second variable capacitor.

16. The plasma processing apparatus of claim 14, wherein the first electrode and the second electrode are radially spaced apart from each other.

17. The plasma processing apparatus of claim 12, further comprisiing a focus ring electrode provided m the focus ring and configured to receive an RF power or direct current (DC) power.

18. A plasma processing apparatus comprising:
   a substrate chuck having a first surface that supports a substrate, a second surface opposite to and extending parallel to the first surface, and a sidewall extending perpendicularly to the first surthce and the second surface and connecting the first surface and the second surface:
   a focus ring that surrounds a perimeter of the substrate;
   an edge block that supports the focus ring and includes a plurality of sub-electrodes that are radially spaced apart from one another along a circumference of the substrate chuck;
   a power supply that supplies radio frequency (RE) power to the substrate chuck; and
   a plurality of variable capacitors that are connected to the plurality of sub-electrodes of the edge block
   wherein each sub-electrode of the plurality of sub-electrodes includes a bottom electrode and a side-electrode connected to the bottom electrode,
   wherein the side electrode extends parallel to the sidewall of the substrate chuck,
   wherein the body is disposed between the side electrode and the substrate chuck and between the bottom electrode and the substrate chuck,
   wherein the bottom electrode has a plate shape that extends along the second surface of the substrate chuck,
   wherein a distance between the bottom electrode and the second surface of the substrate chuck is in a range of about 3 mm to about 30 mm,
   wherein the side electrode is laterally spaced apart from are edge of the substrate so as not to overlap the substrate, and
   wherein at least a part of the bottom electrode overlaps the substrate.

* * * * *